(12) United States Patent
Muntal et al.

(10) Patent No.: US 11,581,801 B2
(45) Date of Patent: Feb. 14, 2023

(54) RECONFIGURABLE LADDER SWITCHED-CAPACITOR CONVERTER

(71) Applicant: Danmarks Tekniske Universitet, Kgs. Lyngby (DK)

(72) Inventors: Pere Llimos Muntal, Copenhagen S (DK); Ivan Harald Holder Jorgensen, Birkerød (DK)

(73) Assignee: DANMARKS TEKNISKE UNIVERSITET, Kgs. Lyngby (DK)

( * ) Notice: Subject to any disclaimer, the term of this patent is extended or adjusted under 35 U.S.C. 154(b) by 141 days.

(21) Appl. No.: 17/056,236

(22) PCT Filed: May 22, 2019

(86) PCT No.: PCT/EP2019/063223
§ 371 (c)(1),
(2) Date: Nov. 17, 2020

(87) PCT Pub. No.: WO2019/224253
PCT Pub. Date: Nov. 28, 2019

(65) Prior Publication Data
US 2021/0167685 A1    Jun. 3, 2021

(30) Foreign Application Priority Data
May 24, 2018 (EP) .................................... 18174002

(51) Int. Cl.
*H02M 1/42* (2007.01)
*G01R 19/165* (2006.01)
(Continued)

(52) U.S. Cl.
CPC .... *H02M 1/4208* (2013.01); *G01R 19/16538* (2013.01); *H02M 1/4266* (2013.01);
(Continued)

(58) Field of Classification Search
CPC .... H02M 3/07; H02M 1/0003; H02M 1/4266; H02M 1/42; H02M 1/4208; H02M 7/483; G01R 19/16538; H03K 17/005
(Continued)

(56) References Cited

U.S. PATENT DOCUMENTS

| 5,491,623 A | 2/1996 | Jansen |
| 2015/0171768 A1* | 6/2015 | Perreault ............... H02M 7/537 330/251 |
| 2020/0295587 A1* | 9/2020 | Giuliano ................. H02M 3/07 |

FOREIGN PATENT DOCUMENTS

| WO | 2015040517 A2 | 3/2015 |
| WO | 2016069803 A1 | 5/2016 |

(Continued)

OTHER PUBLICATIONS

Chengrui et al.: "A Stackable Switched-Capacitor DC/DC Converter IC for LED Drivers with 90% Efficiency", Published in: Proceedings of the IEEE 2013 Custom Integrated Circuits Conference.
(Continued)

*Primary Examiner* — Yemane Mehari
(74) *Attorney, Agent, or Firm* — Dinsmore & Shohl LLP

(57) ABSTRACT

A switched-capacitor converter has a first and second terminal; a switched-capacitor ladder network having a plurality of serially connected first capacitors defining a plurality of flying capacitor nodes; a plurality of serially connected second capacitors defining a plurality of output capacitor nodes, wherein nodes of the flying capacitor nodes can be connected to nodes of the output capacitor nodes in a plurality of ladder converter configurations to perform a switched-capacitor ladder power conversion; and a switch matrix to connect the first terminal to different flying capacitor nodes and/or to connect any flying capacitor node to any other flying capacitor node or output capacitor node accord-
(Continued)

ing to different switch configurations. Also, a switched-capacitor converter assembly may have a plurality of serially and/or parallel connected switched-capacitor reconfigurable switched-capacitor ladder converters. Methods for converting an input into an output voltage using a converter and for operating an assembly of converters are also provided.

18 Claims, 7 Drawing Sheets

(51) Int. Cl.
    *H02M 3/07*      (2006.01)
    *H03K 17/00*      (2006.01)
    *H02M 7/483*      (2007.01)
    *H02M 1/00*      (2006.01)

(52) U.S. Cl.
    CPC ............. *H02M 3/07* (2013.01); *H02M 7/483* (2013.01); *H03K 17/005* (2013.01); *H02M 1/0003* (2021.05)

(58) Field of Classification Search
    USPC .................................................... 363/56, 59
    See application file for complete search history.

(56) References Cited

FOREIGN PATENT DOCUMENTS

| WO | 2016110429 A1 | 7/2016 |
|---|---|---|
| WO | 2017143044 A1 | 8/2017 |
| WO | 2018023695 A1 | 2/2018 |

OTHER PUBLICATIONS

Chengrui et al.: "Reconfigurable Hybrid-Switched-Capacitor-Resonant LED Driver for Multiple Mains Voltages", IEEE Journal of Emerging and Selected Topics in Power Electronics, vol. 6, No. 4, Dec. 2018.

Cortez et al.: "A Family of High-Voltage Gain Single-Phase Hybrid Switched-Capacitor PFC Rectifiers", IEEE Transactions on Power Electronics, Institute of Electrical and Electronics Engineers, USA, vol. 30, No. 8, Aug. 1, 2015, pp. 4189-4198.

Wu et al.: "A Unified Switched Capacitor Converter", 2014 IEEE Energy Conversion Congress and Exposition (ECCE), IEEE, Sep. 14, 2014. pp. 2781-2786.

* cited by examiner

RECONFIGURABLE LADDER SWITCHED-CAPACITOR CONVERTER

CROSS-REFERENCE TO RELATED APPLICATIONS

This application is the U.S. national stage of PCT/EP2019/063223 filed May 22, 2019, which claims priority of European patent application 18174002.8 filed May 24, 2018, both of which are hereby incorporated by reference in their entirety.

FIELD OF THE INVENTION

The present disclosure relates to a reconfigurable ladder switched-capacitor converter and embodiments of switched-capacitor converter assemblies comprising a plurality of reconfigurable ladder connected switched-capacitor converters.

BACKGROUND OF INVENTION

Power converters for converting AC utility mains voltages to DC outputs have, in the past, been implemented using inductor based converter topologies. For low power applications, flyback and forward converters are widely used for e.g. TV sets, medical diagnostics devices and scanners, LED lighting, chargers for laptops and smartphones, and a range of other applications.

On the other hand, switched-capacitor power converters (SCPCs) have been used in battery powered applications for converting the DC voltage of e.g. a Li-Ion battery to the voltage levels required by the electronics in the system, such as microprocessors, random access memories, solid state disks, audio amplifiers etc. SCPCs are also widely used in fully integrated power converters where both switches and capacitors are integrated on an integrated circuit. The use of SCPCs have, however, mostly been limited to low power and low voltage operation.

SCPCs have several advantages. They generate low electromagnetic interference as they are not based on inductors, they are power efficient and they can provide high density implementation. There are also limitations and disadvantages associated with switched-capacitor power converters. They only provide high efficiency in a limited number of input-to-output voltage ratios, hence not suitable for AC-DC conversion. Generally, SCPCs are not suitable for applications in which the input/output voltages need to vary. High-voltage applications of SCPCs require special high-voltage integrated circuit processes which are expensive to manufacture. High-voltage capacitors are large and expensive compared to the largely manufactured low voltage capacitors. It is more difficult to make power-dense and cheap converters using high-voltage capacitors. For this and other reasons SCPCs are conventionally used for low-power applications.

SUMMARY OF INVENTION

The present disclosure relates to a switched-capacitor converter, which overcomes one or several of the known limitations, challenges and disadvantages of such converters. The presently disclosed switched-capacitor converter may provide means for increasing the number of ideal voltage conversion ratios for a switched-capacitor ladder network. The limited number of input-to-output voltage ratios of conventional ladder network based converters may limit the application severely. The presently disclosed switched-capacitor converter comprises, in a first embodiment:
 a first terminal;
 a second terminal;
 a switched-capacitor ladder network comprising a plurality of serially connected first capacitors defining a plurality of flying capacitor nodes; a plurality of serially connected second capacitors defining a plurality of output capacitor nodes, wherein nodes of the flying capacitor nodes can be connected to nodes of the output capacitor nodes in a plurality of ladder converter configurations to perform a switched-capacitor ladder power conversion; and
 a switch matrix configured to connect the first terminal to different flying capacitor nodes and/or configured to connect any flying capacitor node to any other flying capacitor node or output capacitor node according to different switch configurations.

Switched capacitor converters consist of capacitors and switches. The switches are used to connect the capacitors in different phases, thereby performing a voltage conversion ratio $VCR = V_{out}/V_{in}$. A switched-capacitor ladder converter consists of two series-capacitor-strings that slide along each other while charging from the supply and discharging towards the load, as shown in FIG. 1. Each switched-capacitor converter has an ideal voltage conversion ratio iVCR, at which the converter can operate at a theoretical efficiency of 100%. The theoretical peak efficiency (or intrinsic efficiency) of such converter is determined by $Eff = V_{out}/(V_{in} \cdot iVCR) = VCR/iVCR$. As a result, typical switched capacitor converters have high efficiency at a small range of VCRs close to iVCR. FIG. 2 shows an embodiment of the presently disclosed switched-capacitor power converter comprising a ladder topology and a switch matrix for changing the voltage conversion characteristics of the switched-capacitor ladder. By using a switch matrix embedded in the switched-capacitor ladder network, the presently disclosed switched-capacitor converter may extend the range of voltages where the efficiency can be high. This may also allow the converter to efficiently work in applications where the input and/or output voltage vary. The presently disclosed switched-capacitor converter can make high-voltage conversion and applications with varying input/output possible using low-voltage capacitors. The proposed topology may be particularly useful for high voltage AC-DC conversion. Typically, the reconfigurable switched-capacitor ladder converter is used with a rectifier and an input capacitor, as shown in for example FIG. 2.

The first terminal may be an input terminal, and the second terminal may accordingly be an output terminal. The presently disclosed switched-capacitor converter may be reversed in the sense that a step-down converter using this terminology can become a step-up converter if the load is connected to the first terminal and the input voltage to the second terminal. The switched-capacitor converter may further comprise a third terminal, which may be seen as a reference or substrate terminal.

The switch matrix may comprise an input multiplexer for connecting the first terminal, which may be an input terminal, to different flying capacitor nodes and/or to different output capacitor nodes according to different input multiplexer configurations. Using an input multiplexer for choosing in which node of the ladder network the input voltage is applied also allows the converter to function with low input voltages without a large filtering capacitor at the input. It can hereby be noted that having a smaller input capacitor allows the input current to have a more sinusoidal character, which is more efficient form a power factor perspective.

The switch matrix may also comprise an output multiplexer for selecting one node of the output capacitor nodes to connect to the second terminal. The output multiplexer may dynamically select which output capacitor node to connect to the second terminal, which may be the output, of the converter. Both the input multiplexer and the output multiplexer may contribute in increasing the amount of iVCRs of the reconfigurable switched-capacitor ladder converter.

The switch matrix may further comprise at least one bypass switch for bypassing part of the ladder network. In order to further extend the range of voltages where the efficiency can be high, part of the ladder network can be bypassed. In one embodiment, at least one bypass switch can be connected from any flying capacitor node or output capacitor node to any other flying capacitor node or output capacitor node.

The present disclosure further relates to a switched-capacitor converter assembly comprising a plurality of interconnected reconfigurable switched-capacitor ladder converters. By connecting several reconfigurable switched-capacitor ladder converters and having a centralized control for handling the configuration of the switch matrix of the converters, the increased number of iVCRs which is proposed in the presently disclosed reconfigurable ladder topology can be used to extend the range of voltages for the switched-capacitor converter. The plurality of interconnected reconfigurable switched-capacitor ladder converters may be stacked, parallelized and/or serialized. In one embodiment of the presently disclosed switched-capacitor converter assembly, a longer ladder topology can be distributed over several integrated circuits.

The present disclosure further relates to built-in power factor correction capabilities, wherein the control circuit is configured to store and deliver charge to/from the capacitors that are not used in a particular input and/or output and/or bypass multiplexer configuration to perform power factor correction. The PFC capabilities can be seen as a way of utilizing unused energy stored in the non-used capacitors, which may further enhance efficiency, and may also eliminate the need for a separate PFC circuit. The PFC capabilities may be particularly useful in a switched-capacitor converter assembly, wherein a master control can be used to coordinate when to drain and when to charge PFC capacitors of the assembly of switched-capacitor converters. An example is shown in FIG. 5A-B. Connecting the PFC capacitors to a node with lower voltage will deliver charge to the system discharging the PFC capacitors, whereas connecting them to a higher voltage will charge the PFC capacitors.

BRIEF DESCRIPTION OF DRAWINGS

FIG. 5 shows an embodiment of the presently disclosed switched-capacitor converter in a stacked configuration with PFC capabilities.

DEFINITIONS

'Reconfigurable ladder switched-capacitor converter': Comprises a switched-capacitor ladder network, sometimes also referred to as a ladder structure, and a switch matrix. The reconfigurable ladder switched-capacitor converter has at least two terminals: 1 (input), 2 (output) and may further comprise a third terminal 3 (substrate/reference).

'Switched-capacitor ladder network': Refers to an array of switches, wherein series-capacitor-strings can slide along each other while charging from the supply and discharging towards the load.

Figure 6:
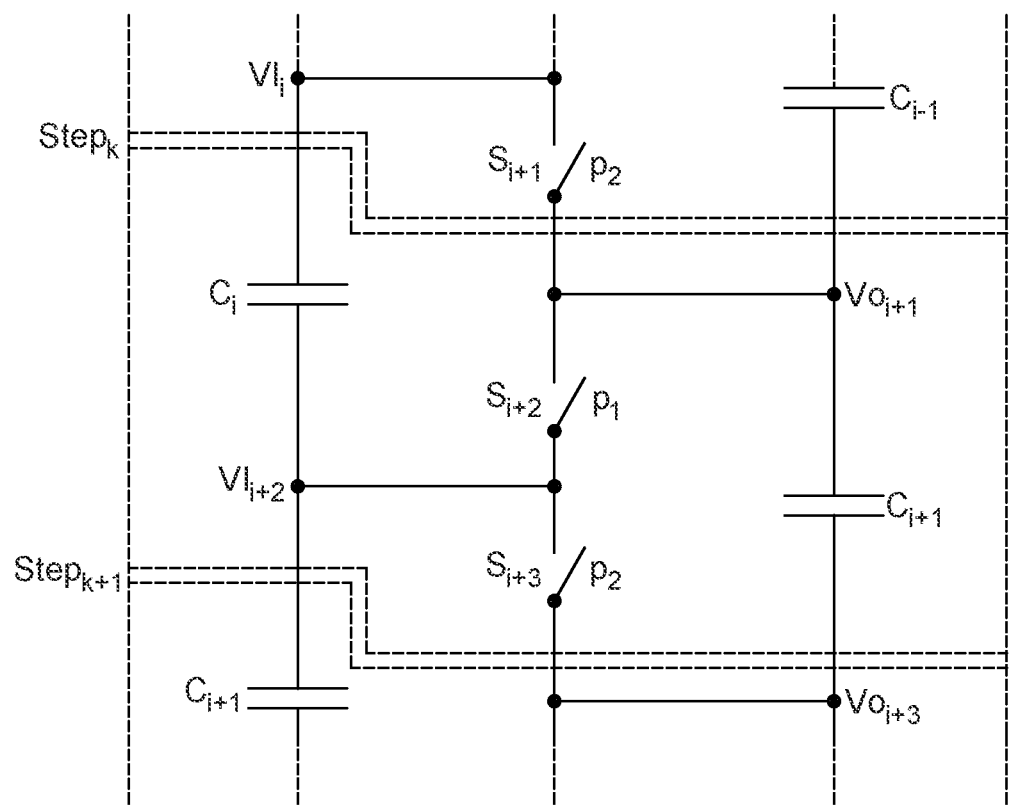
FIG. 6 shows an example of parallelization of switched-capacitor converters.

'Step': Sub-structure of the switched-capacitor ladder converter comprising two switches and two capacitors as shown in FIG. 6. The capacitors are also referred to as 'pairs'.

'Switch matrix': Reconfigurable array of switches in addition to the switched-capacitor ladder network that can change how the switched capacitor power conversion is done. It can change where the terminal 1 (input) of the converter is connected to (input multiplexer) and/or where the terminal 2 (output) of the converter is connected to (output multiplexer) and/or how internal nodes of the structure are connected (using bypassing switches).

'Input multiplexer': Switches of the switch matrix that connect the terminal 1 (input) to an internal node of the reconfigurable ladder switched-capacitor converter.

'Bypassing switches': Switches of the switch matrix that connect an internal node of the RLSCC to an internal node of the RLSCC.

'Output multiplexer': Switches of the switch matrix that connect the terminal 2 (output) to an internal node of the reconfigurable ladder switched-capacitor converter.

'Reconfigurable ladder switched-capacitor converter assembly': Combination of two or more interconnected reconfigurable ladder switched-capacitor converters. The converters of the assembly can be connected in parallel, series or stacked or any useful combination.

'Parallelizing': Parallelized converters have their terminals 1 (input) connected and their terminals 3 (substrate) connected.

'Serializing': Serialized RLSCC have their terminals 2 (output) connected to the terminal 1 (input) of the next converter (except the last one) and their terminals 3 (substrate) connected.

'Stacking': Stacked reconfigurable ladder switched-capacitor converters are connected in such a way that they are equivalent to one reconfigurable ladder switched-capacitor converter with more 'steps'. Stacking allows an increase of number of iVCRs and the possibility of PFC.

'Step-up'/'Step-down': Step-up converter has a larger voltage at the output than at the input. A step-down converter has a larger voltage at the input than at the output.

DETAILED DESCRIPTION OF THE INVENTION

Figure 2:
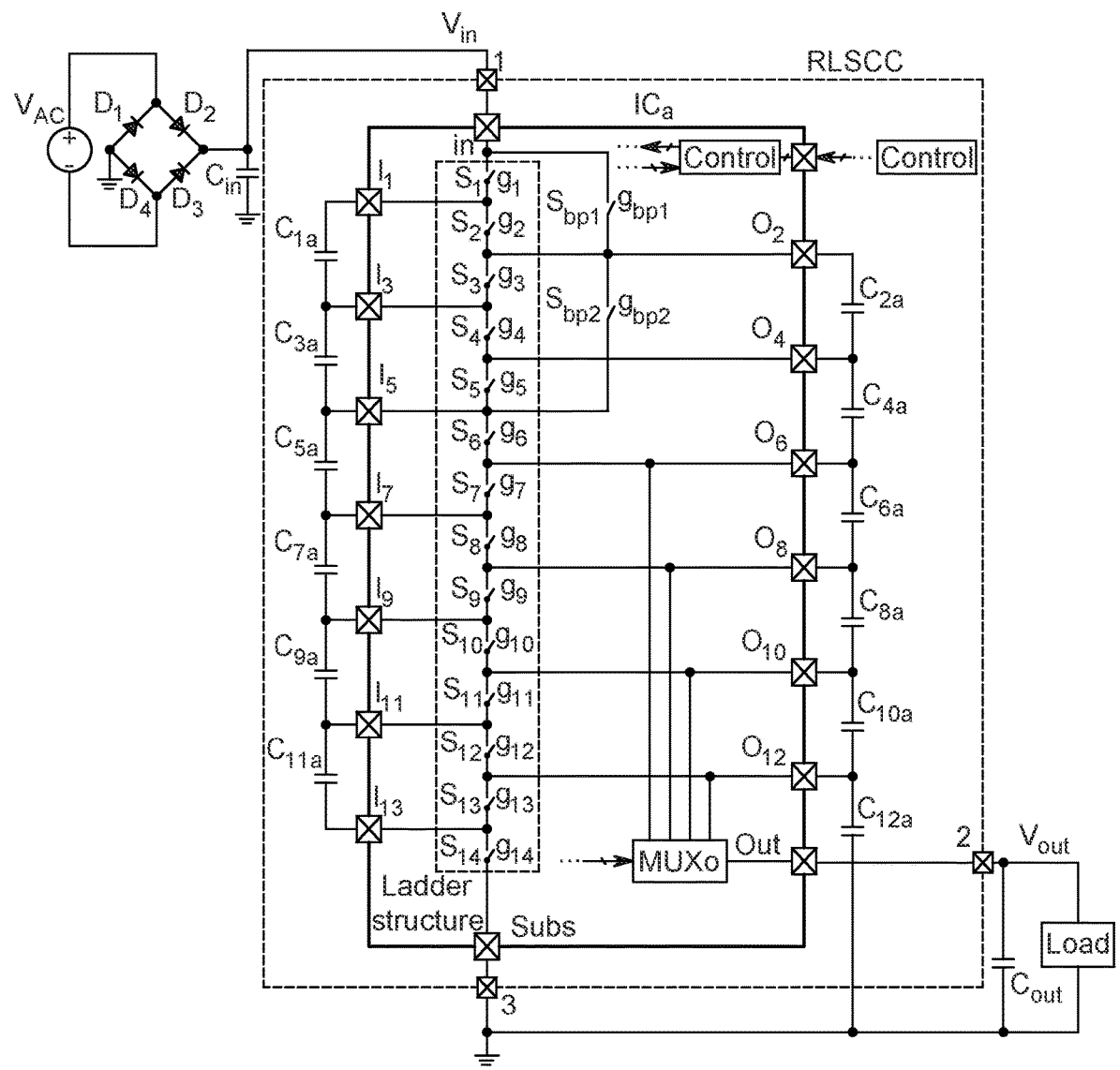
FIG. 2 shows an embodiment of the presently disclosed switched-capacitor converter having an input multiplexer, output multiplexer and bypass switches.

The present disclosure relates to a switched-capacitor converter comprising a switched-capacitor ladder network, at least a first terminal and at least a second terminal, wherein the switched-capacitor converter comprises a switch matrix. The switched-capacitor ladder network may comprise a plurality of serially connected first capacitors defining a plurality of flying capacitor nodes; and a plurality of serially connected second capacitors defining a plurality of output capacitor nodes. FIG. 2 shows an example of serially connected first capacitors $C_{1a}$-$C_{11a}$, and serially connected second capacitors $C_{2a}$-$C_{12a}$. The nodes are defined by the connection between the capacitors. "Serially connected" within the meaning of the present invention shall not limit the topology to the serially connected capacitors used without any other connections. "Serially" only refers to the internal arrangement of the capacitors. As shown in the examples, the multiplexers and bypass switches may connect other nodes and components to the serially connected first capacitors and serially connected second capacitors. "Serially connected" refers to the internal arrangement of the serially connected first capacitors and serially connected second capacitors, respectively.

A ladder converter typically comprises series-capacitor-strings that slide along each other while charging from the supply and discharging towards the load. A converter with a total number of capacitors equal to N, excluding the output capacitor, has an iVCR of (2/(N+2)). The converter operates at a theoretical efficiency of 100% at iVCR. Existing topologies provide high efficiency at a limited number of input-to-output voltage ratios, and therefore not suited for AC-DC conversion. The presently disclosed switched-capacitor converter may comprise a switch matrix configured to connect the first terminal to different flying capacitor nodes and/or to different output capacitor nodes and/or configured to select one node of the output capacitor nodes to connect to the second terminal according to different switch configurations. By using a switch matrix embedded in the switched-capacitor ladder network, the presently disclosed switched-capacitor converter may extend the range of voltages where the efficiency can be high. The proposed topology may therefore be useful for high voltage AC-DC conversion. The presently disclosed switched-capacitor converter may be an AC-DC converter, preferably used with a rectifier and an input capacitor, as shown in FIG. 2. However, it is also possible to configure the converter for DC-DC purposes, or even DC-AC or AC/AC. One embodiment includes a rectifier in connection with the first terminal, preferably with an input capacitor, wherein the switched-capacitor converter is configured as a DC-DC converter. The first capacitors may be what is commonly referred to as flying capacitors of a switched-capacitor ladder converter. The second capacitors may accordingly be what is commonly referred to as output capacitors of the switched-capacitor ladder converter. Moreover, the converter may comprise a single switched-capacitor ladder network, wherein the input multiplexer and/or output multiplexer and/or bypass multiplexer is/are configured to bypass terminals and/or nodes of the single switched-capacitor ladder network. Alternatively, several of the switched-capacitor ladder converters may be stacked.

The serially connected first capacitors and serially connected second capacitors can be seen as steps comprising pairs of capacitors and switches. For example, in the embodiment of FIG. 2, $C_{1a}$ and $C_{2a}$ form one pair of capacitors. FIG. 6 shows an example of a 'step' according to the present invention. The converter may have n pairs or steps, wherein n is an integer higher or equal to 2. The ladder structure may accordingly comprise 2*n serially arranged switches arranged in serial pairs ($p_1$, $p_2$), or n steps, as shown in FIG. 2. Each node between the switches of each pair may be connected to a corresponding flying capacitor node.

Voltage Levels and Technology

The typical operation voltage levels of an integrated circuit (IC) depend on the fabrication process. For standard CMOS fabrication processes, those voltages may range from e.g. 0.9-3.3V. Other semiconductor materials than silicon, such as GaN, may also been used. For these ranges the fabrication process is well-known and relatively inexpensive. For some applications this range is not sufficient. Special high-voltage CMOS fabrication processes may operate at higher voltages, such as 20V, 40V, or 120V. These voltage levels are still not sufficient for some applications, such as circuits connected to the AC mains (400V). Fabrication processes that can tolerate higher voltages, i.e. 400V, 700V etc. are available but more expensive. By using the presently disclosed reconfigurable switched-capacitor ladder converter and stacking several of the converters, it is possible to handle these high voltage levels. Another advantage is that the invention allows use of more low-voltage transistors and capacitors instead of high-voltage components.

In one embodiment, each converter is adapted to support maximum voltages of at least 20 V, preferably at least 40 V, more preferably at least 60 V, even more preferably at least 80 V, most preferably at least 100 V on the first terminal with reference to a third terminal reference voltage on a third terminal. Each converter may also be adapted to support voltages of at least 20 V, preferably at least 40 V, more preferably at least 60 V, even more preferably at least 80 V, most preferably at least 100 V on the second terminal. In one example, the converter is fabricated with a high-voltage CMOS process which can tolerate up to 120V. That means that each converter can handle 120V. By stacking several converters, higher voltages can be tolerated. If for example 4 converters are stacked, up to 480V can be tolerated. A large number of possible iVCRs, which can be achieved with the presently disclosed reconfigurable switched-capacitor ladder converter having a switch matrix, allows a high efficiency over a wider range of VCRs.

Multiplexers, Switches and Configurations

As stated, the presently disclosed switched-capacitor ladder converter may comprise an input multiplexer and/or an output multiplexer and/or bypass switches. FIG. 2 can serve as an example including all three of these switches. A switch may be implemented in a number of ways. It may be a single NMOS or PMOS silicon switch, GaN switch, SiC switch, or bipolar switch. It may also be two serial connected transistors arranged to ensure that the switch can block both positive and negative drain-source voltage. It may also be implemented using a serial connection of a diode and a switch to achieve bidirectional blocking. The converter has a first terminal in the form of input in, a second terminal in the form of output out, first capacitors $C_{1a}$, $C_{3a}$, $C_{5a}$, $C_{7a}$, $C_{9a}$, $C_{11a}$. The converter further comprises second capacitors $C_{2a}$, $C_{4a}$, $C_{6a}$, $C_{8a}$, $C_{10a}$, $C_{12a}$. The converter further comprises an input multiplexer for connecting the first terminal to different flying capacitor nodes and/or to different output capacitor nodes. The input multiplexer comprises switches $S_{bp1}$ and $S_{bp2}$. $S_{bp2}$ can also act as a bypass switch. In this example the input multiplexer and the bypass switches are implemented with the same switches. In the example the first terminal can be connected to nodes $O_2$ and $I_5$. In other configurations the first terminal can be connected to any flying capacitor node or capacitor node.

The switch matrix further comprises an output multiplexer for selecting one node of the output capacitor nodes to connect to the second terminal. The output multiplexer allows selecting a suitable output voltage, which may be used to further increase the number of iVCRs that can be achieved.

The switch matrix may further comprise at least one bypass switch for bypassing part of the ladder network. The converter in the example of FIG. 2 comprises two bypass switches $S_{bp1}$ and $S_{bp2}$. In this example $S_{bp1}$ may also be seen as an input multiplexer switch. The at least one bypass switch may be connected from any flying capacitor node to any other flying capacitor node. Preferable, the at least one bypass switch(es) is/are dynamically configurable. The bypass switches may be used to dynamically bypass part of the ladder.

The presently disclosed switched-capacitor converter comprises a first terminal, which may be for example an input port, as in FIG. 2, and a second terminal, which may be for example an output port, as in. FIG. 2, which may be connected to an output capacitor or a PFC capacitor. If several converters are used, the output capacitors of the converters that are not the output of the assembly can be used for PFC. The switched-capacitor converter may further comprise a third terminal connected to a last capacitor of the serially connected second capacitors. Such a third terminal is denoted "subs" in FIG. 2. The terminal may be connected to ground. In order to bypass the whole converter, the first terminal can be connected to the third terminal. In a special case, in order to bypass a converter, the first terminal can be connected to a fourth terminal. The switched-capacitor converter may further comprise an end output capacitor, wherein the end output capacitor is connected between the second terminal and the third terminal. The converter assembly may comprise an end output terminal of the whole assembly, corresponding to one or more of the output terminals of the individual converters.

As stated above, the switches of the converter are used to connect the capacitors in different phases, thereby performing a voltage conversion ratio. By adjusting the frequency in which the phases of the switched capacitor converter are toggled and/or the conductance of the switches, the voltage conversion ratio is configured. The switching frequency can be dynamically adjusted. If different iVCRs are used, a fine regulation for an exact ratio that falls between the available iVCRs may achieved by adjusting the frequency or the switch conductance. In the case of a transistor implementation of the switch, the conductance regulation can be done by an overdrive voltage or by the number of active fingers of the transistor.

"Dynamically configurable" within the present disclosure refers to the possibility to use different configurations of the multiplexers and bypassing switches to change the iVCRs during operation in order to adapt to a changing environment or changing requirements. This may include for example constraints on the output voltage or on the input voltage or on the conversion ratio between the input and output voltages. Any multiplexer may be dynamically configurable, including the input multiplexer, the output multiplexer and the bypass multiplexer. If several of the presently disclosed reconfigurable switched-capacitor ladder converters are stacked in for example a serial or parallel arrangement, it may be useful to control the configurations of the individual converters in a centralized manner.

Accordingly, the presently disclosed switched-capacitor ladder converter may further comprise a control circuit operable to control the input multiplexer and/or output multiplexer and/or bypass multiplexer. The control circuit may be further configured to control the ladder structure, the switching frequency and/or the switch conductance. Preferably, all switches are fully controllable by the control circuit. The control circuit may be operable to control the input multiplexer and/or output multiplexer and/or bypass multiplexer dynamically, to change a voltage conversion ratio between the first terminal and the second terminal. In combination with the toggling/switching frequency, the voltage conversion ratio is obtained. The control circuit may be configured to control the input multiplexer and/or output multiplexer and/or bypass multiplexer dynamically based on an input voltage on the first terminal and/or based on an output voltage on the second terminal and/or based on the voltage conversion ratio between the first terminal and the second terminal. The control circuit may be configured to adapt the conversion ratio between the first terminal and the second terminal dynamically according to an oscillating AC voltage. The control circuit may also be configured to control the input multiplexer and/or output multiplexer and/or bypass multiplexer dynamically based on an input current on the first terminal and/or based on an output current on the second terminal.

The dynamic configurations may be useful for a range of scenarios. For example, if the input is an AC signal, the converter may adapt according to the AC signal. The input voltage may also be a rectified AC signal. Consequently the presently disclosed converter may further comprise a rectifier in connection with the first terminal, preferably with an input capacitor, as shown in FIG. 2.

In one embodiment, the control circuit is configured to adapt the conversion ratio according to a predetermined desired output voltage on the second terminal. The switched-capacitor ladder network can be said to be programmed to "follow" a specific output voltage. Accordingly, a switching frequency/conductance setup and a "gear", i.e. a multiplexer, ladder structure, setup corresponding to a conversion ratio, are configured based on the output voltage. This may be implemented as follows: In one embodiment the input multiplexer and/or output multiplexer and/or bypass multiplexer are updated to increase the conversion ratio when the output voltage drops below the predetermined wanted output voltage, preferably when the output voltage drops below the predetermined wanted output voltage during a predefined minimum period of time, or wherein the input multiplexer and/or output multiplexer and/or bypass multiplexer are updated to decrease the conversion ratio when the output voltage exceeds the predetermined wanted output voltage, preferably when the output voltage exceeds the predetermined wanted output voltage during a predefined minimum period of time.

Power Factor Correction

Power factor of an AC electrical power system refers to the ratio of the real power flowing to the load to the apparent power in the circuit. Specifically, in AC-DC applications, there may be a phase angle between input current and voltage, which creates power losses. Active power factor correction (PFC) is the use of power electronics to change the waveform of current drawn by a load to improve the power factor. Generally, PFC typically uses a number of capacitors to offset a load.

The inventors of the presently disclosed reconfigurable switched-capacitor ladder converter and stack of reconfigurable switched-capacitor ladder converters have realized that the capacitors that are not used in the ladder network at certain points can instead be used for power factor correction purposes. In one embodiment, the presently disclosed switched-capacitor converter therefore further comprises embedded power factor correction capabilities, wherein the control circuit is configured to store and deliver charge to/from the capacitors that are not used in a particular input and/or output and/or bypass multiplexer configuration to perform power factor correction. The control circuit may be arranged to configure the switches of the ladder network and/or the switch matrix to access the capacitors that are not used in a particular input and/or output and/or bypass multiplexer configuration for power factor correction. The PFC capabilities may be used in any operation mode of the reconfigurable switched-capacitor ladder converter, including for example dynamic shaping of an AC input current according to an AC input voltage. Based on the switching pattern and power pattern of the converter, the control circuit may control how the PFC capacitors are charged and recharged.

Figure 5A:
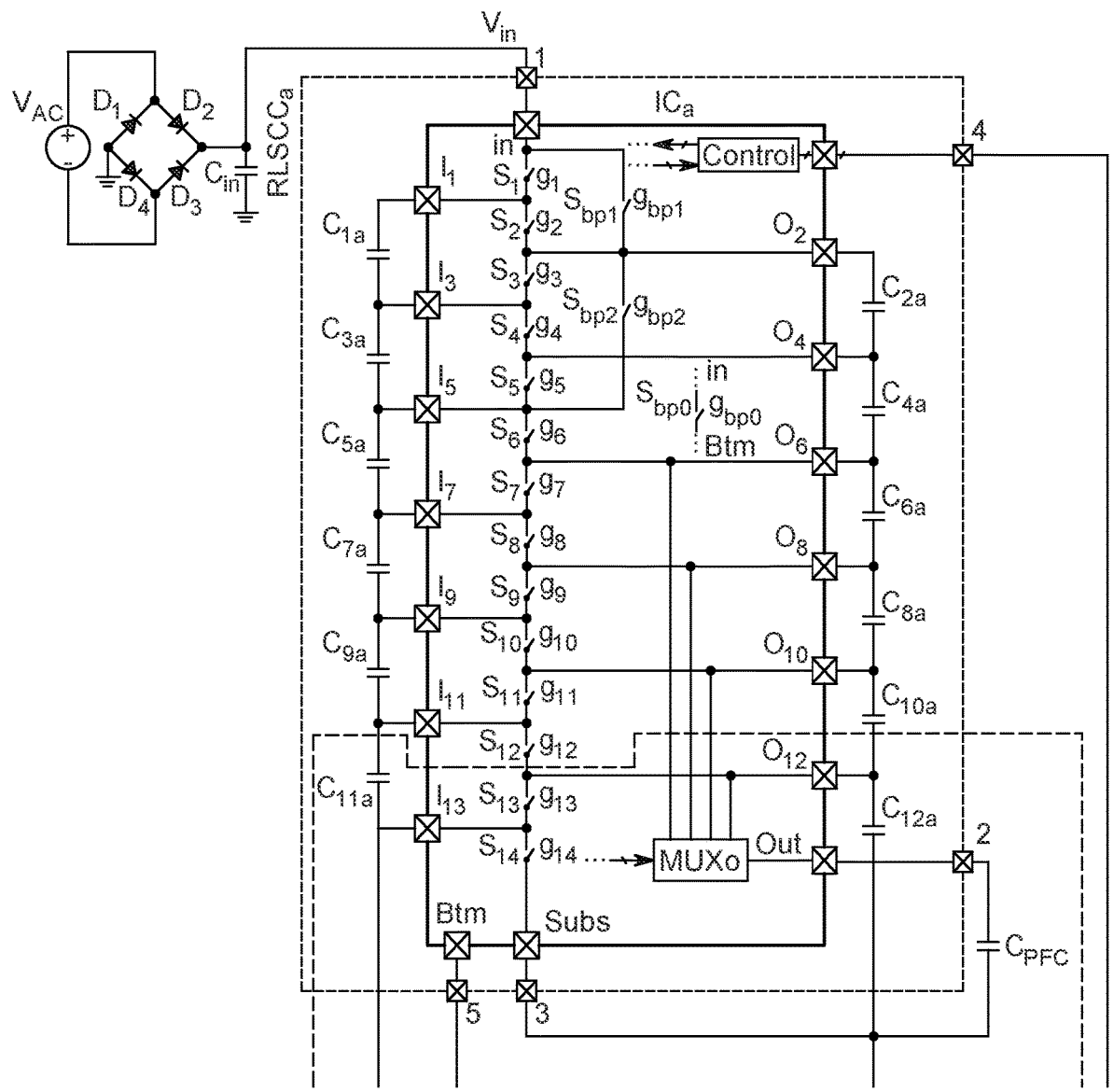
FIG. 5A shows a first reconfigurable switched-capacitor converter.
Figure 5B:
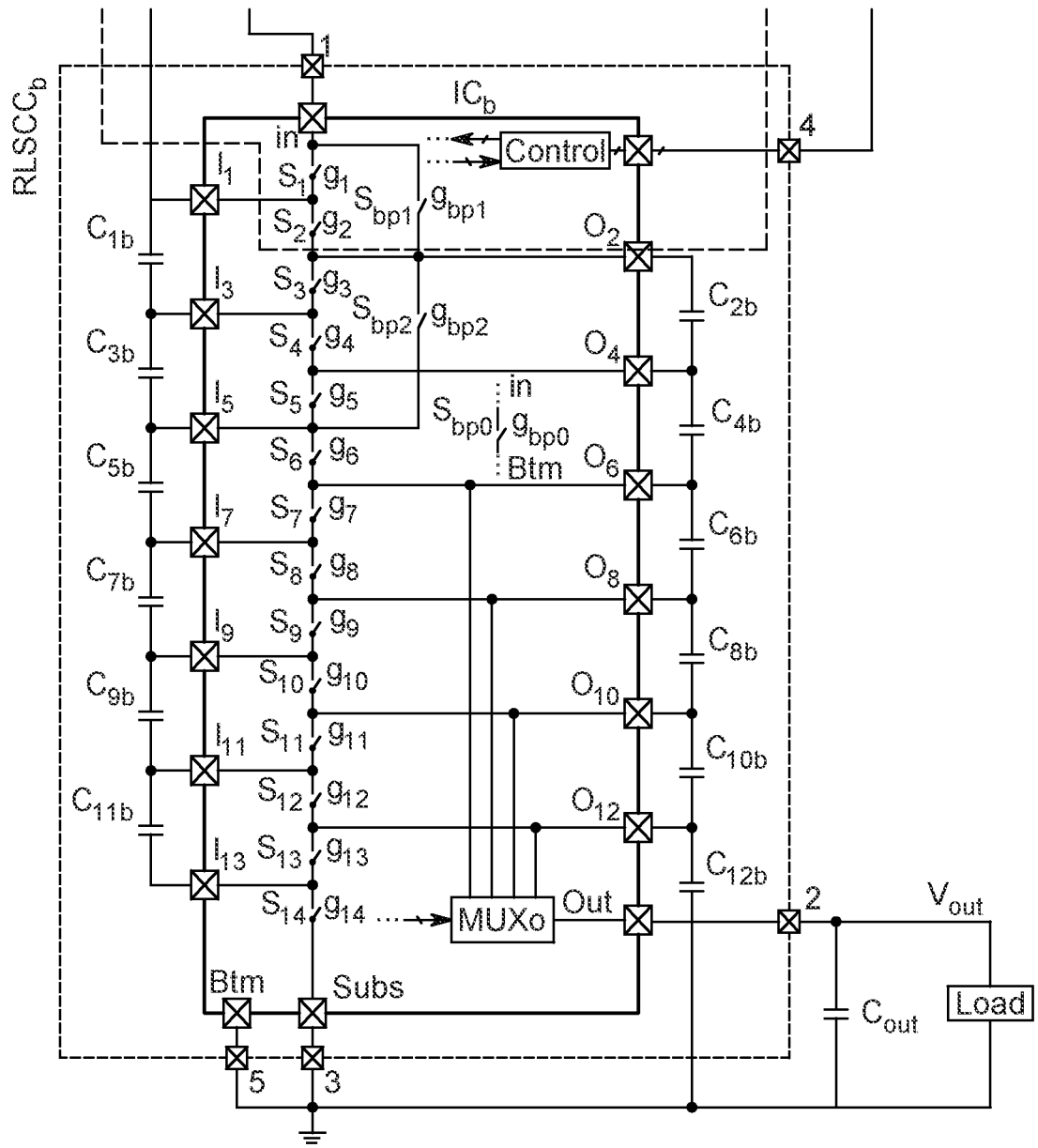
FIG. 5B shows a second reconfigurable switched-capacitor converter connected to the first reconfigurable switched-capacitor converter.

FIG. 5 shows an example of stacked reconfigurable switched-capacitor ladder converters with power factor correction. FIG. 5A shows the first reconfigurable switched-capacitor ladder converter and FIG. 5B shows the second and in this case last reconfigurable switched-capacitor ladder converter. There may be additional reconfigurable switched-capacitor ladder converters between the first and last converters. A PFC capacitor $C_{PFC}$ in FIG. 5A operates as a deliver/storage unit This capacitor can deliver/store charge depending on the operating cycle of the converter in order to correct the power factor. A master chip controls the rest of slave chips, and controls when to charge or discharge the PFC capacitor in order to deliver or receive charge from the system. Additional reconfigurable switched-capacitor ladder converters between the first and last converters may have similar $C_{PFC}$ capacitors. It can be seen in FIG. 5A that the PFC capacitor is connected to the second terminal (out, 2). The third terminal ("subs") is connected to the other side (far side in relation to the second terminal) of the $C_pFc$ capacitor. In the example, one 'step' extends over both the last section of the first reconfigurable switched-capacitor ladder converter and the first section of the second reconfigurable switched-capacitor ladder converter, as indicated with a dotted lines section covering both FIG. 5A and FIG. 5B. Other ways of connecting the converters to act as a continuous ladder are possible.

Stacked Switched-Capacitor Converters

The present disclosure further relates to a stacked switched-capacitor converter assembly comprising a plurality of serially connected reconfigurable switched-capacitor ladder converters. By stacking several reconfigurable switched-capacitor ladder converters, the increased number of iVCRs, which is proposed in the presently disclosed reconfigurable ladder topology, can be used to extend the range of voltages for the stacked switched-capacitor converter. The switched-capacitor converters may form a chain of switched-capacitor converters. An increased number of iVCRs may be more useful when used in a stacked embodiment since the voltages may generally be higher, for example 400V in the example of a connection to AC mains, which increases the need for increased granularity and flexibility related to the voltage conversion ratio. It can be noted that the local converters may still be able to operate at low voltages, which may keep the fabrication costs low. In one embodiment, the assembly is adapted to support combined voltages over the stacked connected switched-capacitor converters of at least 100 V, preferably at least 200 V, more preferably at least 300 V, even more preferably at least 400 V. The control may be centralized to coordinate the operation if the individual converters.

The switched-capacitor converter assembly may comprise a plurality of stacked switched-capacitor converters, each switched-capacitor converter comprising:

a first terminal;
a second terminal; and
a switched-capacitor ladder network comprising a plurality of serially connected first capacitors defining a plurality of flying capacitor nodes; a plurality of serially connected second capacitors defining a plurality of output capacitor nodes, wherein nodes of the flying capacitor nodes can be connected to nodes of the output capacitor nodes in a plurality of ladder converter configurations to perform a switched-capacitor ladder power conversion.

Preferably, each of the stacked switched-capacitor converters comprise a switch matrix configured to connect the first terminal to different flying capacitor nodes and/or to different output capacitor nodes and/or configured to select one node of the output capacitor nodes to connect to the second terminal and/or configured to connect any flying capacitor node to any other flying capacitor node or output capacitor node according to different switch configurations. The stacked converters may be any embodiment of the presently disclosed switched-capacitor converter.

Figure 4:
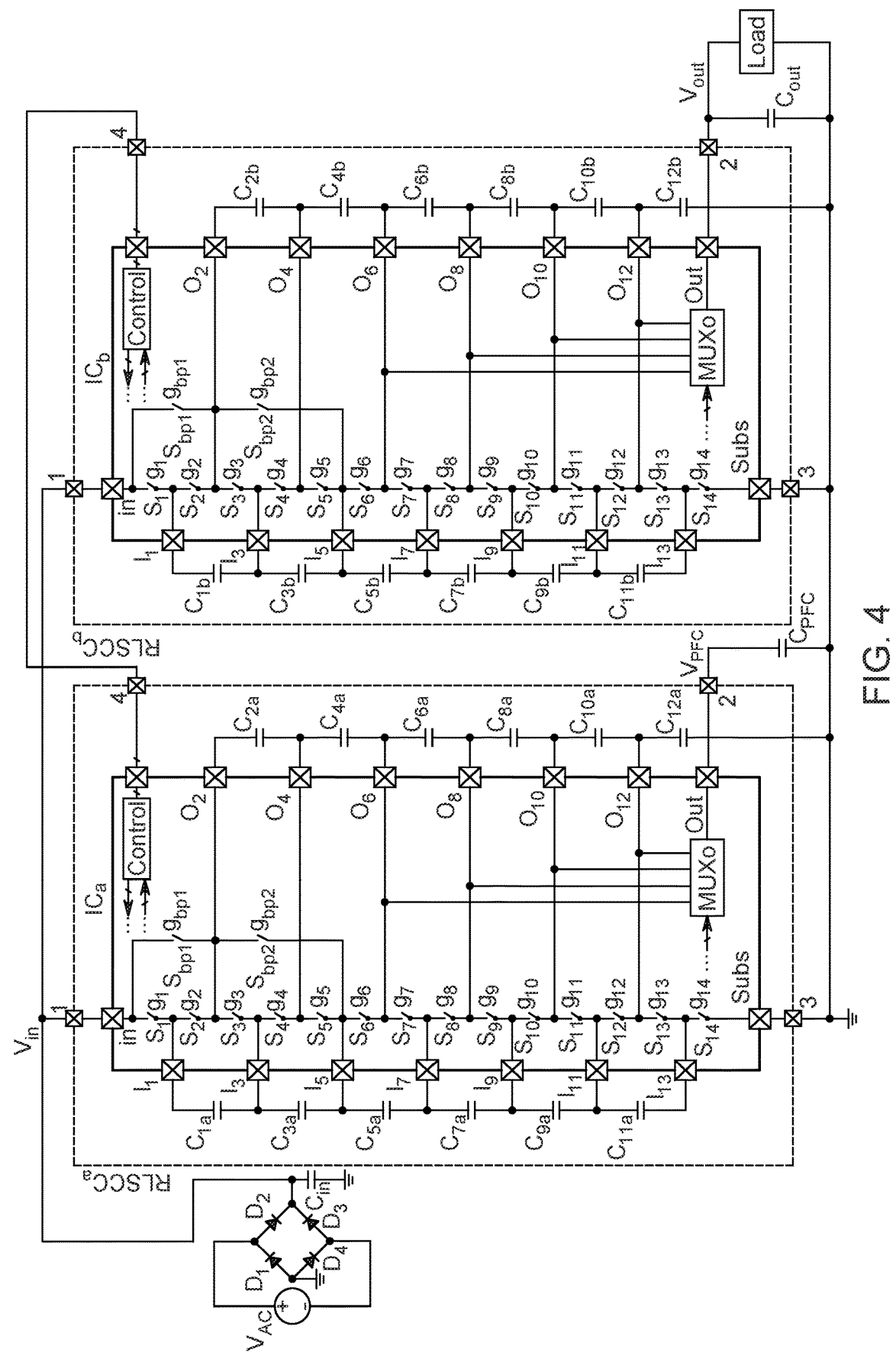
FIG. 4 shows an example of an assembly of parallel interconnected switched-capacitor converters.

The stacked switched-capacitor converter assembly may also comprise a plurality of parallel chains of switched-capacitor converters, as shown in FIG. 4. The parallelization can be used increase the maximum power of the system. Moreover, the clock to the parallel branches can be interleaved to reduce ripple.

The power factor capabilities may be useful in the stacked switched-capacitor converter assembly. At least one, preferably several, of the stacked connected switched-capacitor converters may comprise a power factor correction capacitor connected to the second terminal, as shown in for example FIG. 2. The power factor correction capacitors may be charged or discharged to and/or from nodes of the stacked switched-capacitor converter assembly to correct the power factor of the assembly. Preferably, the charging and discharging of power factor corrections capacitors are handled by a central control unit.

Operation of the Reconfigurable Ladder Switched-Capacitor Converter

The present disclosure further relates to a method for converting an input into an output voltage using a switched-capacitor converter. Preferably the reconfigurable ladder switched-capacitor comprises a first terminal; a second terminal; a switched-capacitor ladder network comprising a plurality of serially connected first capacitors defining a plurality of flying capacitor nodes; a plurality of serially connected second capacitors defining a plurality of output capacitor nodes. The method may comprise the steps of: measuring the input and output voltages; and dynamically adapting a conversion ratio between the input and output voltages of the switched-capacitor converter by connecting the first terminal to different flying capacitor nodes and/or to different output capacitor nodes and/or by selecting one node of the output capacitor nodes to connect to the second terminal, thereby achieving more efficient power conversion for varying input and/or output voltages.

The step of dynamically adapting the conversion rate of the switched-capacitor converter may comprise the step of dynamically controlling an input multiplexer of a switch matrix for connecting the first terminal to different flying capacitor nodes and/or to different output capacitor nodes; and/or comprising dynamically controlling an output multiplexer of a switch matrix for selecting one node of the output capacitor nodes to connect to the second terminal; and/or comprising dynamically controlling a bypass switch of a switch matrix for bypassing part of the ladder network.

The switched-capacitor ladder network may be switched by a switching frequency, and the conductance of the switches can be adjusted to provide a conversion ratio between the first terminal and the second terminal. By operating the presently disclosed reconfigurable ladder switched-capacitor as described a range of different iVCRs can be achieved. If different iVCRs are used, a fine regulation for an exact ratio that falls between the available iVCRs may achieved by adjusting the frequency and/or the conductance of the switches.

The method may be applied to any embodiment of the presently disclosed reconfigurable ladder switched-capacitor.

The present disclosure further relates to method for operating an assembly of switched-capacitor converters. Preferably, each converter comprising a first terminal; a second terminal; a switched-capacitor ladder network comprising a plurality of serially connected first capacitors defining a plurality of flying capacitor nodes; a plurality of serially connected second capacitors defining a plurality of output capacitor nodes; an end output capacitor; and a switch matrix for connecting the first terminal to different flying capacitor nodes and/or to different output capacitor nodes and/or configured to select one node of the output capacitor nodes to connect to the second terminal according to different switch configuration. Preferably, the method comprising the steps of: measuring an input voltage and/or current of the switched-capacitor converter, dynamically shaping an input current waveform to an input voltage waveform using the end output capacitors that are not used in a particular switch matrix configuration, to store and deliver charge in a power factor correction operation. Preferably, a central control unit controls the operation of the converters.

DETAILED DESCRIPTION OF DRAWINGS

The invention will in the following be described in greater detail with reference to the accompanying drawings. The drawings are exemplary and are intended to illustrate some of the features of the presently disclosed reconfigurable ladder switched-capacitor converter and stacked switched-capacitor converter assemblies, and are not to be construed as limiting to the presently disclosed invention.

Figure 1:
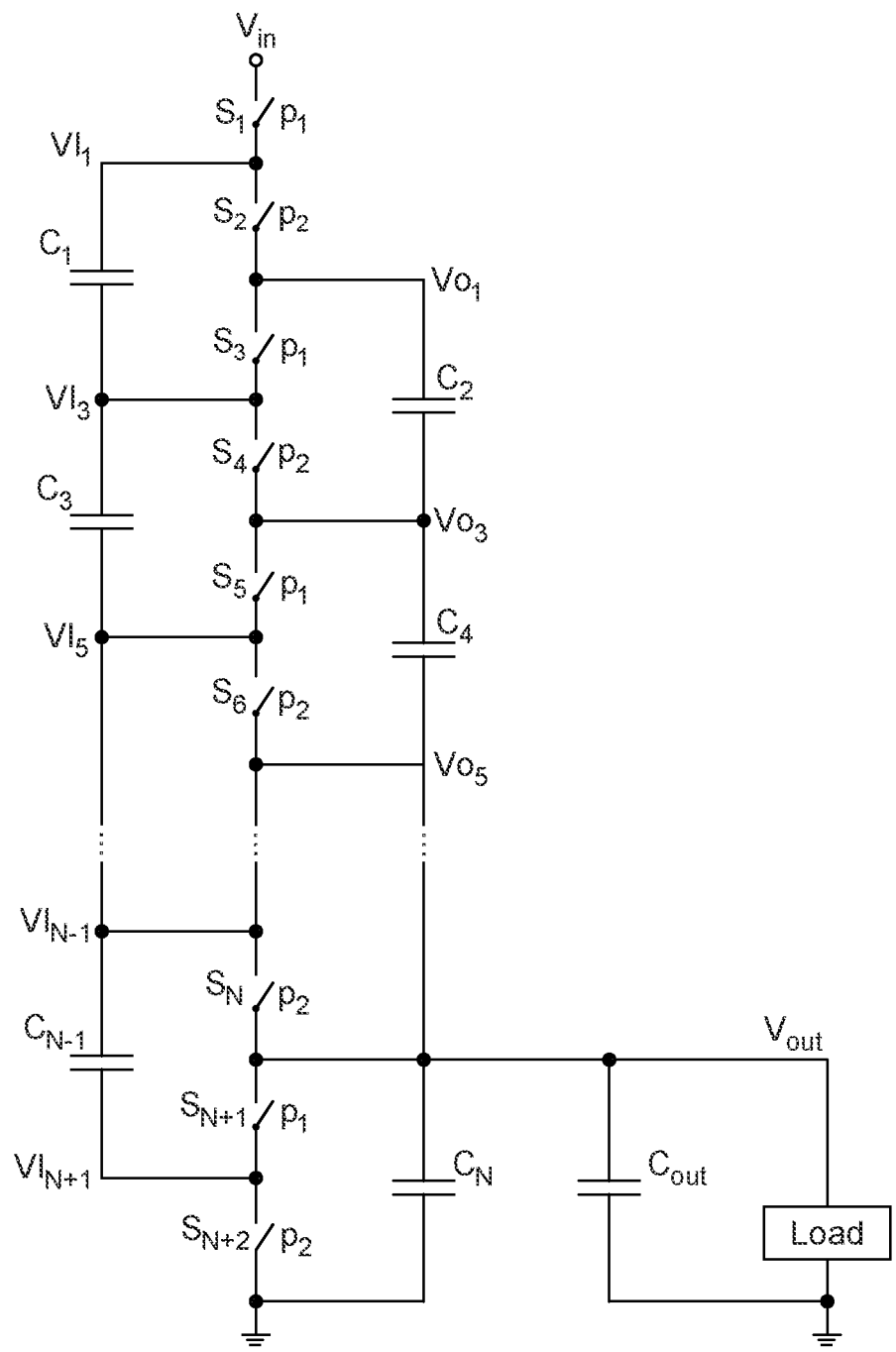
FIG. 1 shows a prior art switched-capacitor ladder converter.

FIG. 1 shows a prior art switched-capacitor ladder converter. For this switched-capacitor ladder converter, iVCR=2/(N+2) where N is the total number of capacitors.

FIG. 2 shows an embodiment of the presently disclosed switched-capacitor converter having an input multiplexer, output multiplexer and bypass switches. Two bypass switches $S_{bp1}$ and $S_{bp2}$ are configurable to bypass part of the output stage of the converter. $S_{bp1}$ can also be seen as an input multiplexer switch. The input multiplexer can be seen as the switches $S_{bp1}$-$S_{bp2}$, i.e. in this case same as the bypass switches, controlled by the controller (Control). $S_{bp2}$ can also be used as a bypass switch. An output multiplexer (MUXo) selects the output node. The first terminal is denoted $V_{in}$ (1) in this embodiment. The second terminal is the output of the multiplexer (out, 2), which is connected to $C_{out}$. The third terminal is denoted subs (3) in this embodiment. In the example, the capacitors ($C_{1a}$-$C_{11a}$, $C_{2a}$-$C_{12a}$) are external capacitors.

Figure 3:
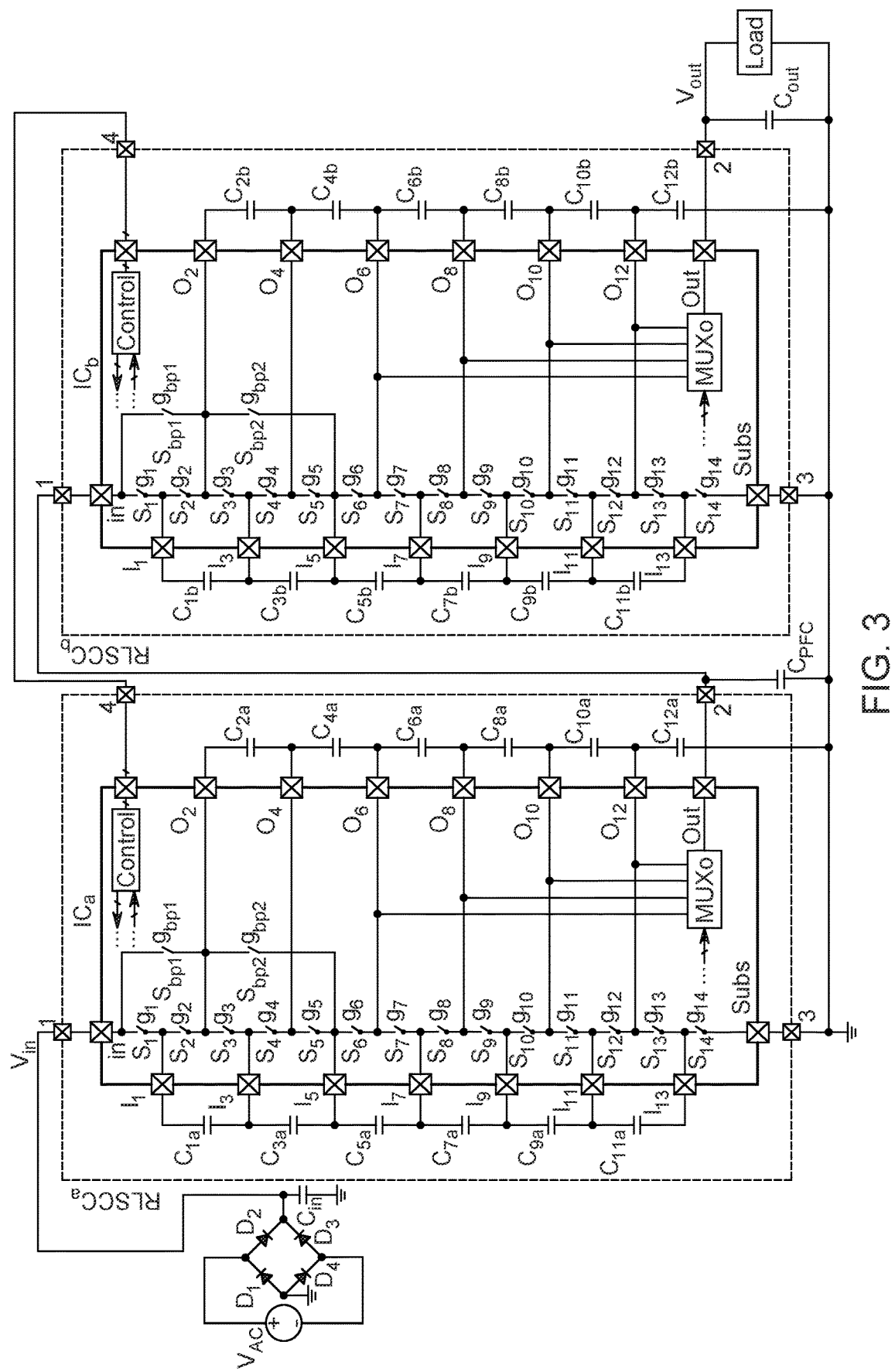
FIG. 3 shows an example of an assembly of serially connected switched-capacitor converters.

FIG. 3 shows another embodiment of the presently disclosed switched-capacitor converter, wherein two converters are serially connected. The first converter comprises a rectifier with an input capacitor $C_{in}$ in connection with the first terminal "in" (1). The first converter comprises first capacitors $C_{1a}$, $C_{3a}$, $C_{5a}$, $C_{7a}$, $C_{9a}$, $C_{11a}$. The converter further comprises second capacitors $C_{2a}$, $C_{4a}$, $C_{6a}$, $C_{8a}$, $C_{10a}$, $C_{12a}$. The converter further comprises an input multiplexer for connecting the first terminal to different flying capacitor nodes and/or to different output capacitor nodes. The input multiplexer comprises switches $S_{bp1}$-$S_{bp2}$. The first terminal can thereby be connected to any flying capacitor node. There are two bypass switches $S_{bp1}$ and $S_{bp2}$, as well as an output multiplexer (MUXo) and a control unit (Control). $S_{bp1}$ can also be seen as an input multiplexer switch. The second converter has a similar arrangement but has the output out (2) connected to a load and an output capacitor $C_{out}$, and the third terminal (subs) connected to ground. The serial connection between the converters comprises a connection from the output of the first converter to the input of the second converter and a common reference connected to both "subs" terminals The control units of the converters are also connected for coordination of the control.

FIG. 4 shows an example of an assembly of parallel interconnected switched-capacitor converters. The first converter comprises a rectifier with an input capacitor $C_{in}$ in connection with the first terminal in/$b_{p1}$. The first converter comprises first capacitors $C_{1a}$, $C_{3a}$, $C_{5a}$, $C_{7a}$, $C_{9a}$, $C_{11a}$. The converter further comprises second capacitors $C_{2a}$, $C_{4a}$, $C_{6a}$, $C_{8a}$, $C_{10a}$, $C_{12a}$. The converter further comprises an input multiplexer for connecting the first terminal to different flying capacitor nodes and/or to different output capacitor nodes. The input multiplexer comprises switches $S_{bp1}$-$S_{bp2}$. $S_{bp2}$ can also be used as a bypass switch on its own, hence it can perform both input multiplexing functionality with $S_{bp1}$ or bypass functionality on its own. The first terminal can thereby be connected to an internal node. There are two bypass switches $S_{bp1}$, $S_{bp2}$. $S_{bp1}$ can also be seen as an input multiplexer switch. In the assembly, the second terminal out is connected to a PFC capacitor $C_{PFC}$. The third terminal subs is connected both to the other side of $C_{PFC}$ and to the "subs"/reference terminal of the next converter. The input ("in", 1) of the next converter comes from the same node as the input to the first converter.

FIG. 5 shows an embodiment of the presently disclosed switched-capacitor converter in a stacked configuration with PFC capabilities. FIG. 5A shows a first reconfigurable switched-capacitor converter. The PFC capacitor $P_{PFC}$ operates as an energy deliver/storage unit. This capacitor can deliver/store charge depending on the operating cycle of the converter in order to correct the power factor. A master chip controls the rest of slave chips, and controls when to charge or discharge the PFC capacitor in order to deliver or receive charge from the system. Connecting the PFC capacitors to a node with lower voltage delivers charge to the system discharging the PFC capacitors, whereas connecting the PFC capacitors to a higher voltage charges the PFC capacitors. The PFC capacitors can be connected to several voltage levels due to the built-in auxiliary switching matrix of the converter. FIG. 5B shows a second reconfigurable switched-capacitor converter connected to the first reconfigurable switched-capacitor converter.

FIG. 6 shows an example of what is referred to as a 'step' ($step_k$) in the present disclosure. The step comprises two capacitors $C_i$ and $C_{i+1}$ and two switches $s_{i+2}$ and $S_{i+3}$. A step can be defined as a sub-structure of the switched-capacitor converter having two switches and two capacitors.

FURTHER DETAILS OF THE INVENTION

1. A switched-capacitor converter comprising:
   a first terminal;
   a second terminal;
   a switched-capacitor ladder network comprising a plurality of serially connected first capacitors defining a plurality of flying capacitor nodes; a plurality of serially connected second capacitors defining a plurality of output capacitor nodes, wherein nodes of the flying capacitor nodes can be connected to nodes of the output capacitor nodes in a plurality of ladder converter configurations to perform a switched-capacitor ladder power conversion; and
   a switch matrix configured to connect the first terminal to different flying capacitor nodes and/or configured to connect any flying capacitor node to any other flying capacitor node or output capacitor node according to different switch configurations.
2. The switched-capacitor converter according to item 1, wherein the switch matrix comprises an input multiplexer for connecting the first terminal to different flying capacitor nodes and/or to different output capacitor nodes, according to different input multiplexer configurations.
3. The switched-capacitor converter according to any of the preceding items, wherein the switch matrix comprises an output multiplexer for selecting one node of the output capacitor nodes to connect to the second terminal.
4. The switched-capacitor converter according to any of the preceding items, wherein the switched-capacitor converter is an AC-DC converter.
5. The switched-capacitor converter according to any of the preceding items, further comprising a rectifier in connection with the first terminal, preferably with an input capacitor, wherein the switched-capacitor converter is a DC-DC converter or a rectified AC-DC converter.
6. The switched-capacitor converter according to any of the preceding items, further comprising an input capacitor connected to the first terminal.
7. The switched-capacitor converter according to any of the preceding items, wherein the first terminal is an input terminal.
8. The switched-capacitor converter according to any of the preceding items, wherein the second terminal is an output terminal.
9. The switched-capacitor converter according to any of the preceding items, wherein the first capacitors are flying capacitors of the ladder network and the second capacitors are output capacitors of the ladder network.
10. The switched-capacitor converter according to any of the preceding items, wherein the switch matrix comprises at least one bypass switch for bypassing part of the ladder network.
11. The switched-capacitor converter according to item 10, wherein the at least one bypass switch can be connected from any flying capacitor node to any other flying capacitor node or output capacitor node.
12. The switched-capacitor converter according to any of items 9-11, wherein the at least one bypass switch(es) is/are dynamically configurable.
13. The switched-capacitor converter according to any of the preceding items, wherein the input multiplexer is configurable to connect the first terminal to any flying capacitor node or output capacitor node.
14. The switched-capacitor converter according to any of the preceding items, wherein the switch matrix is further configured to connect the first terminal to different output capacitor nodes.
15. The switched-capacitor converter according to any of the preceding items, wherein the switch matrix is further configured to select one node of the output capacitor nodes to connect to the second terminal.
16. The switched-capacitor converter according to any of the preceding items, further comprising a third terminal.
17. The switched-capacitor converter according to item 16, wherein the third terminal is reference terminal.
18. The switched-capacitor converter according to any of items 16-17, wherein the third terminal is connected to ground.
19. The switched-capacitor converter according to any of items 16-18, wherein the first terminal is connected to ground and/or the third terminal, thereby fully bypassing the converter.
20. The switched-capacitor converter according to any of the preceding items, wherein the input multiplexer is further configurable to connect the first terminal to the second terminal, thereby fully bypassing the converter.
21. The switched-capacitor converter according to any of the preceding items, further comprising an end output capacitor ($C_{OUT}$ or $C_{PFC}$), preferably wherein the end output capacitor ($C_{OUT}$ or $C_{PFC}$) is connected between the second terminal and the third terminal.
22. The switched-capacitor converter according to any of the preceding items, wherein the switched-capacitor ladder network is switched by a switching frequency to provide a corresponding conversion ratio between the first terminal and the second terminal.
23. The switched-capacitor converter according to any of the preceding items, wherein the input multiplexer is dynamically configurable.
24. The switched-capacitor converter according to any of the preceding items, wherein the output multiplexer is dynamically configurable and/or wherein the at least one bypass switch is/are dynamically configurable.
25. The switched-capacitor converter according to any of the preceding items, further comprising a control circuit operable to control the input multiplexer and/or output multiplexer and/or at least one bypass switch.
26. The switched-capacitor converter according to any of items 9-12 and item 25, wherein the control circuit is further operable to control the at least one bypass switch.
27. The switched-capacitor converter according to any of items 25-26, wherein the control circuit is operable to control the input multiplexer and/or output multiplexer and/or bypass multiplexer dynamically, thereby changing a voltage conversion ratio between the first terminal and the second terminal.
28. The switched-capacitor converter according to any of items 25-27, wherein the control circuit is configured to control the input multiplexer and/or output multiplexer and/or bypass multiplexer dynamically based on an input voltage on the first terminal and/or based on an output voltage on the second terminal and/or based on the voltage conversion ratio between the first terminal and the second terminal.
29. The switched-capacitor converter according to any of items 25-28, wherein the control circuit is configured to control the input multiplexer and/or output multiplexer and/or bypass multiplexer dynamically based on an input current on the first terminal and/or based on an output current on the second terminal.

30. The switched-capacitor converter according to any of the preceding items, wherein the input voltage is rectified AC signal.
31. The switched-capacitor converter according to item 28, wherein the input voltage is an AC voltage or a rectified AC voltage.
32. The switched-capacitor converter according to item 31, wherein the control circuit is configured to adapt the conversion ratio between the first terminal and the second terminal dynamically according to an oscillating AC voltage.
33. The switched-capacitor converter according to any of items 25-32, wherein the control circuit is configured to adapt the conversion ratio according to a predetermined desired output voltage on the second terminal.
34. The switched-capacitor converter according to item 33, wherein the input multiplexer and/or output multiplexer and/or bypass multiplexer are updated to increase the conversion ratio when the output voltage drops below the predetermined wanted output voltage, preferably when the output voltage drops below the predetermined wanted output voltage during a predefined minimum period of time, or wherein the input multiplexer and/or output multiplexer and/or bypass multiplexer are updated to decrease the conversion ratio when the output voltage exceeds the predetermined wanted output voltage, preferably when the output voltage exceeds the predetermined wanted output voltage during a predefined minimum period of time.
35. The switched-capacitor converter according to any of the preceding items, wherein a switching frequency and/or switch conductance of the switched-capacitor ladder network is configured based on the output voltage.
36. The switched-capacitor converter according to item 35, wherein a gear of the switched-capacitor ladder network is configured based on the switching frequency.
37. The switched-capacitor converter according to any of items 35-36, wherein the control circuit is operable to dynamically configure the switching frequency and/or the conductance of the switches.
38. The switched-capacitor converter according to any of the preceding items, wherein the converter comprises a single switched-capacitor ladder network, wherein the input multiplexer and/or output multiplexer and/or bypass multiplexer is/are configured to bypass terminals and/or nodes of the single switched-capacitor ladder network.
39. The switched-capacitor converter according to item 38, wherein all switches and/or conductance of the switches are fully controllable.
40. The switched-capacitor converter according to any of the preceding items, further comprising embedded power factor correction capabilities, wherein the control circuit is configured to store and deliver charge to/from capacitors that are not used in a particular input and/or output and/or bypass multiplexer configuration to perform power factor correction.
41. The switched-capacitor converter according to item 40 and item 21, wherein the control circuit is configured to store and deliver charge to/from the end output capacitor ($C_{OUT}$ or $C_{PFC}$).
42. The switched-capacitor converter according to any of items 40-41-, wherein the control circuit is configured to dynamically shape an AC input current according to an AC input voltage.
43. The switched-capacitor converter according to any of items 40-42, wherein switches of the ladder network and/or input multiplexer and/or multiplexer are used to access the capacitors that are not used in a particular input and/or output and/or bypass multiplexer configuration for the power factor correction.
44. The switched-capacitor converter according to any of the preceding items, further comprising a power factor correction capacitor connected to the second terminal.
45. The switched-capacitor converter according to any of the preceding items, wherein the converter is adapted to support voltages of at least 20 V, preferably at least 40 V, more preferably at least 60 V, even more preferably at least 80 V, most preferably at least 100 V on the first terminal.
46. The switched-capacitor converter according to any of the preceding items, wherein the converter is adapted to support voltages of at least 20 V, preferably at least 40 V, more preferably at least 60 V, even more preferably at least 80 V, most preferably at least 100 V on the second terminal.
47. The switched-capacitor converter according to any of the preceding items, wherein the ladder network has n steps, wherein n is an integer higher or equal to 2.
48. The switched-capacitor converter according to item 47, wherein the switched-capacitor ladder network comprises 2*n serially arranged switches arranged in steps, wherein each node between the switches of each step is connected to a corresponding flying capacitor node.
49. A switched-capacitor converter assembly comprising a plurality of serially connected switched-capacitor converters according to any of items 1-48, forming a chain of switched-capacitor converters.
50. The switched-capacitor converter assembly according to item 49, wherein a ground terminal of each converter is connected to the first terminal of the next converter.
51. The switched-capacitor converter assembly according to any of items 49-50, wherein the converters comprise a bypass terminal, and wherein the bypass terminal of each converter is connected to the first terminal of the next converter.
52. The switched-capacitor converter assembly according to any of items 49-50, comprising a plurality of parallel chains of switched-capacitor converters.
53. The switched-capacitor converter assembly according to any of items 49-52, further comprising a central control unit for controlling the connected switched-capacitor converters.
54. The switched-capacitor converter assembly according to any of items 49-52, wherein at least one of the serially connected switched-capacitor converters comprises a power factor correction capacitor connected to the second terminal.
55. The switched-capacitor converter assembly according to item 54, wherein the power factor correction capacitors can be charged or discharged to and/or from nodes of the switched-capacitor converter assembly to correct the power factor of the assembly.
56. The switched-capacitor converter assembly according to any of items 53-55, wherein the central control unit is configured to control the charging and discharging of capacitors capable of performing power factor correction. 57. The switched-capacitor converter assembly according to any of items 53-55, wherein the assembly is adapted to support combined voltages over the serially connected switched-capacitor converters of at least 100 V, preferably at least 200 V, more preferably at least 300 V, even more preferably at least 400 V.
58. A switched-capacitor converter assembly comprising a plurality of connected switched-capacitor converters according to any of items 1-48 connected in parallel.
59. A switched-capacitor converter assembly comprising a plurality of connected switched-capacitor converters according to any of items 47-48, wherein the plurality of connected switched-capacitor converters are arranged and connected such that the number of steps is extended.
60. A method for converting an input into an output voltage using a switched-capacitor converter comprising a first terminal; a second terminal; a switched-capacitor ladder network comprising a plurality of serially connected first capacitors defining a plurality of flying capacitor nodes; a plurality of serially connected second capacitors defining a plurality of output capacitor nodes; said method comprising the steps of: measuring the input and output voltages; and dynamically adapting a conversion ratio to the input and output voltages of the switched-capacitor converter by connecting the first terminal to different flying capacitor nodes and/or to different output capacitor nodes and/or by selecting one node of the output capacitor nodes to connect to the second terminal and/or by connection any flying capacitor node to any other flying capacitor node or output capacitor node, thereby achieving more efficient power conversion for varying input and/or output voltages.
61. The method according to item 60, wherein the step of dynamically adapting the conversion rate of the switched-capacitor converter comprises dynamically controlling an input multiplexer of a switch matrix for connecting the first terminal to different flying capacitor nodes and/or to different output capacitor nodes; and/or comprising dynamically controlling an output multiplexer of a switch matrix for selecting one node of the output capacitor nodes to connect to the second terminal; and/or comprising dynamically controlling a bypass switch of a switch matrix for bypassing part of the ladder network.
62. The method according to any of items 60-61, wherein the switched-capacitor converter is the switched-capacitor converter of any of items 1-48.
63. A method for operating an assembly of switched-capacitor converters, each converter comprising a first terminal; a second terminal; a switched-capacitor ladder network comprising a plurality of serially connected first capacitors defining a plurality of flying capacitor nodes; a plurality of serially connected second capacitors defining a plurality of output capacitor nodes; an end output capacitor; and a switch matrix for connecting the first terminal to different flying capacitor nodes and/or to different output capacitor nodes and/or configured to select one node of the output capacitor nodes to connect to the second terminal according to different switch configuration, the method comprising the steps of: measuring an input voltage and/or current of the switched-capacitor converter, dynamically shaping an input current waveform to an input voltage waveform using the end output capacitors that are not used in a particular switch matrix configuration, to store and deliver charge in a power factor correction operation.
64. The method according to item 63, wherein the switched-capacitor converters are switched-capacitor converter according to any of items 1-48.

The invention claimed is:
1. A switched-capacitor converter comprising:
a first terminal;
a second terminal;
a switched-capacitor ladder network comprising a plurality of serially connected first capacitors defining a plurality of flying capacitor nodes; a plurality of serially connected second capacitors defining a plurality of output capacitor nodes, wherein nodes of the flying capacitor nodes can be connected to nodes of the output capacitor nodes in a plurality of ladder converter configurations to perform a switched-capacitor ladder power conversion;
a switch matrix configured to connect the first terminal to different flying capacitor nodes and/or configured to connect any flying capacitor node to any other flying capacitor node or output capacitor node according to different switch configurations; and
a control circuit operable to control an input multiplexer and/or output multiplexer and/or at least one bypass switch,
wherein the control circuit is operable to control the input multiplexer and/or output multiplexer and/or bypass multiplexer dynamically, thereby changing a voltage conversion ratio between the first terminal and the second terminal.
2. The switched-capacitor converter according to claim 1, wherein the switch matrix comprises the input multiplexer for connecting the first terminal to different flying capacitor nodes and/or to different output capacitor nodes, according to different input multiplexer configurations.
3. The switched-capacitor converter according to claim 1, wherein the switch matrix comprises the output multiplexer for selecting one node of the output capacitor nodes to connect to the second terminal.
4. The switched-capacitor converter according to claim 1, wherein the switch matrix comprises the at least one bypass switch for bypassing part of the ladder network.
5. The switched-capacitor converter according to claim 1, further comprising a third terminal and an end output capacitor (COUT or CPFC), wherein the end output capacitor (COUT or CPFC) is connected between the second terminal and the third terminal.
6. The switched-capacitor converter according to claim 1, wherein the switch matrix is further configured to connect the first terminal to different output capacitor nodes.
7. The switched-capacitor converter according to claim 1, wherein the switch matrix is further configured to select one node of the output capacitor nodes to connect to the second terminal.
8. The switched-capacitor converter according to claim 1, wherein the input multiplexer is dynamically configurable and/or wherein the output multiplexer is dynamically configurable and/or wherein the at least one bypass switch is/are dynamically configurable.

9. The switched-capacitor converter according to claim 1, wherein the input voltage is a rectified AC signal.

10. The switched-capacitor converter according to claim 1, wherein the input voltage is an AC voltage or a rectified AC voltage, and wherein the control circuit is configured to adapt the conversion ratio between the first terminal and the second terminal dynamically according to an oscillating AC voltage.

11. The switched-capacitor converter according to claim 1, wherein the control circuit is configured to store and deliver charge to/from the end output capacitor (COUT or CPFC), preferably wherein the control circuit is configured to dynamically shape an AC input current according to an AC input voltage.

12. A switched-capacitor converter assembly comprising a plurality of connected switched-capacitor converters according to claim 1.

13. The switched-capacitor converter assembly according claim 12, wherein the switched-capacitor converters are stacked.

14. A switched-capacitor converter, comprising:
   a first terminal;
   a second terminal;
   a switched-capacitor ladder network comprising a plurality of serially connected first capacitors defining a plurality of flying capacitor nodes; a plurality of serially connected second capacitors defining a plurality of output capacitor nodes, wherein nodes of the flying capacitor nodes can be connected to nodes of the output capacitor nodes in a plurality of ladder converter configurations to perform a switched-capacitor ladder power conversion;
   a switch matrix configured to connect the first terminal to different flying capacitor nodes and/or configured to connect any flying capacitor node to any other flying capacitor node or output capacitor node according to different switch configurations; and
   a control circuit operable to control an input multiplexer and/or output multiplexer and/or at least one bypass switch,
   wherein the control circuit is configured to adapt the conversion ratio according to a predetermined desired output voltage on the second terminal, and wherein the input multiplexer and/or output multiplexer and/or bypass multiplexer are updated to increase the conversion ratio when the output voltage drops below the predetermined wanted output voltage, preferably when the output voltage drops below the predetermined wanted output voltage during a predefined minimum period of time, or wherein the input multiplexer and/or output multiplexer and/or bypass multiplexer are updated to decrease the conversion ratio when the output voltage exceeds the predetermined wanted output voltage, preferably when the output voltage exceeds the predetermined wanted output voltage during a predefined minimum period of time.

15. A switched-capacitor converter, comprising:
   a first terminal;
   a second terminal;
   a switched-capacitor ladder network comprising a plurality of serially connected first capacitors defining a plurality of flying capacitor nodes; a plurality of serially connected second capacitors defining a plurality of output capacitor nodes, wherein nodes of the flying capacitor nodes can be connected to nodes of the output capacitor nodes in a plurality of ladder converter configurations to perform a switched-capacitor ladder power conversion;
   a switch matrix configured to connect the first terminal to different flying capacitor nodes and/or configured to connect any flying capacitor node to any other flying capacitor node or output capacitor node according to different switch configurations;
   a control circuit operable to control an input multiplexer and/or an output multiplexer and/or at least one bypass switch; and
   embedded power factor correction capabilities, wherein the control circuit is configured to store and deliver charge to/from capacitors that are not used in a particular input and/or output and/or bypass multiplexer configuration to perform power factor correction.

16. A method for converting an input into an output voltage using a switched-capacitor converter comprising a first terminal; a second terminal; a switched-capacitor ladder network comprising a plurality of serially connected first capacitors defining a plurality of flying capacitor nodes; a plurality of serially connected second capacitors defining a plurality of output capacitor nodes; a control circuit operable to control an input multiplexer and/or an output multiplexer and/or at least one bypass switch; said method comprising the steps of:
   measuring the input and output voltages; and
   operating the control circuit to dynamically adapt a conversion ratio between the input and output voltages of the switched-capacitor converter by controlling the input multiplexer and/or output multiplexer and/or bypass switch dynamically, thereby changing a voltage conversion ratio between the first terminal and the second terminal thereby achieving more efficient power conversion for varying input and/or output voltages.

17. A method for operating an assembly of switched-capacitor converters, each converter comprising a first terminal; a second terminal; a switched-capacitor ladder network comprising a plurality of serially connected first capacitors defining a plurality of flying capacitor nodes; a plurality of serially connected second capacitors defining a plurality of output capacitor nodes; an end output capacitor; and a switch matrix for connecting the first terminal to different flying capacitor nodes and/or to different output capacitor nodes and/or configured to select one node of the output capacitor nodes to connect to the second terminal according to different switch configuration, the method comprising the steps of:
   measuring an input voltage and/or current of the switched-capacitor converter;
   converting an input voltage to an output voltage; and
   performing power factor correction by storing and delivering charge to/from capacitors that are not used in a particular input and/or output configuration.

18. A switched-capacitor converter assembly comprising a plurality of stacked switched-capacitor converters, each switched-capacitor converter comprising:
   a first terminal;
   a second terminal;
   a switched-capacitor ladder network comprising a plurality of serially connected first capacitors defining a plurality of flying capacitor nodes; a plurality of serially connected second capacitors defining a plurality of output capacitor nodes, wherein nodes of the flying capacitor nodes can be connected to nodes of the output capacitor nodes in a plurality of ladder converter configurations to perform a switched-capacitor ladder power conversion;

a switch matrix configured to connect the first terminal to different flying capacitor nodes and/or to different output capacitor nodes and/or configured to select one node of the output capacitor nodes to connect to the second terminal and/or configured to connect any flying capacitor node to any other flying capacitor node or output capacitor node according to different switch configurations; and a control circuit operable to control an input multiplexer and/or an output multiplexer and/or at least one bypass switch, wherein the control circuit is configured to adapt the conversion ratio according to a predetermined desired output voltage on the second terminal, and wherein the input multiplexer and/or output multiplexer and/or bypass switch are updated to increase the conversion ratio when the output voltage drops below the predetermined desired output voltage.

\* \* \* \* \*